(12) United States Patent
Ellens et al.

(10) Patent No.: US 6,504,179 B1
(45) Date of Patent: Jan. 7, 2003

(54) LED-BASED WHITE-EMITTING ILLUMINATION UNIT

(75) Inventors: Andries Ellens, Den Haag (NL); Frank Jermann, Munich (DE); Franz Kummer, Munich (DE); Michael Ostertag, Munich (DE); Franz Zwaschka, Ismaning (DE)

(73) Assignees: Patent-Treuhand-Gesellschaft fur elektrische Gluhlampen mbH, Munich (DE); OSRAM Opto Semiconductors GmbH & Co. OHG, Regensburg (DE)

( * ) Notice: Subject to any disclaimer, the term of this patent is extended or adjusted under 35 U.S.C. 154(b) by 35 days.

(21) Appl. No.: 10/031,578

(22) PCT Filed: May 23, 2001

(86) PCT No.: PCT/DE01/01955

§ 371 (c)(1),
(2), (4) Date: Jan. 17, 2002

(87) PCT Pub. No.: WO01/93342

PCT Pub. Date: Dec. 6, 2001

(30) Foreign Application Priority Data

May 29, 2000 (DE) .......................................... 100 26 435
Feb. 11, 2001 (DE) ..................................... 201 08 013 U (51) Int. Cl.[7] ............................................... H01L 33/00
(52) U.S. Cl. ............................ 257/88; 257/97; 257/98; 257/99
(58) Field of Search ............................ 257/88, 98, 97, 257/99

(56) References Cited

U.S. PATENT DOCUMENTS 3,602,753 A * 8/1971 Evans et al. .......... 252/301.6 S
3,875,449 A * 4/1975 Byler et al. ........... 252/301.6 S
4,405,880 A * 9/1983 Gallaro et al. ........ 252/301.6 F
4,559,469 A * 12/1985 Welker et al. ........ 252/301.4 F
5,998,925 A  12/1999 Shimizu et al.
6,255,670 B1 * 7/2001 Srivastava et al. .......... 257/100
6,278,135 B1 * 8/2001 Srivastava et al. ............ 257/89
6,294,800 B1 * 9/2001 Duggal et al. .............. 257/100

FOREIGN PATENT DOCUMENTS

| DE | 196 38 667 A | 2/1998 |
| WO | WO 98/12757 | 3/1998 |
| WO | WO 98/39805 A | 9/1998 |
| WO | WO 00 57490 PA | 9/2000 |

OTHER PUBLICATIONS

"Luminescence Properties and Energy Transfer of EU2+ Doped CA8MG (S104) 4CL2 Phosphors", Journal of the Electrochemical Society, Electrochemical Society, Manchester, New Hampshire, US, Bd. 139, Nr. 2, Feb. 1, 1992, pp. 622–625.

* cited by examiner

Primary Examiner—Chandra Chaudhari
Assistant Examiner—William Vesperman
(74) Attorney, Agent, or Firm—Frishauf, Holtz, Goodman & Chick, P.C.

(57) ABSTRACT

A white-emitting luminescence conversion LED uses a chlorosilicate phosphor which, in addition to Ca and Mg, contains a europium doping, and also a garnet phosphor of the rare earths, in particular Y and/or Tb. In this way, it is possible to achieve a high color rendering and a high constancy of the lighting properties under differing temperature conditions.

10 Claims, 8 Drawing Sheets

LED-BASED WHITE-EMITTING ILLUMINATION UNIT

This application is a U.S. National Phase Application under 35 USC 371 of International Application PCT/DE01/01955 (not published in English) filed May 23, 2001.

FIELD OF THE INVENTION

The invention relates to an LED-based white-emitting illumination unit, in which the LED emits primary UV radiation or blue light. Moreover, at least one yellow-emitting phosphor and one green-emitting phosphor are used for partial conversion of the primary radiation. The yellow phosphor used is a Ce-activated garnet which contains in particular Y and/or Tb. The green phosphor used is an Eu-activated calcium magnesium chlorosilicate ($Ca_8Mg(SiO_4)_4Cl_2$).

BACKGROUND OF THE INVENTION

J. Electrochem. Soc. 1992, p. 622 has already disclosed a chlorosilicate phosphor and its use for UV and blue-light excitation, which is doped with Eu (Luminescence Properties and Energy Transfer of $Eu^{2+}$ Doped $Ca_8Mg(SiO_4)_4Cl_2$ Phosphors). It lights up in the green spectral region. A specific application for this phosphor is not described.

Luminescence conversion LEDs which emit white light are currently produced by combining a blue Ga(In)N LED which emits at approximately 460 nm and a yellow-emitting $YAG:Ce^{3+}$ phosphor (U.S. Pat. No. 5,998,925 and EP 862 794). However, these white light LEDs can only be used to a limited extent for general-purpose illumination, on account of their poor color rendering caused by the absence of color components (primarily the red component). An alternative is to mix three colors RGB (red, green, blue), which together result in white, cf. for example WO 98/39805.

SUMMARY OF THE INVENTION

It is an object of the present invention to provide an illumination unit based on an LED in accordance with the preamble of claim 1 which emits white light and in particular has a high color rendering.

These objects are achieved by the characterizing features of claim 1. Particularly advantageous configurations are given in the dependent claims.

Previous solutions for a white LED have been based in particular either on the RGB approach, i.e. on mixing three colors, namely red, green and blue, in which case the latter component may be provided by a phosphor or by the primary emission of the LED, or, in a second, simplified solution, on mixing blue and yellow (BY approach), as discussed in the introduction.

According to the invention, a completely new concept which is based on a BYG mixture, i.e. the combination of a blue, yellow and green color, is used for the first time. The essential factor is that the yellow phosphors are so broad-banded that they also have a sufficient proportion of the emission in the red spectral region, in particular a proportion of at least 20% of their total emission in the visible region lies in a spectral region $\geq 620$ nm.

A Ce-activated garnet of the rare earths (RE), preferably with RE selected from Y, Tb, Gd, Lu and/or La, has proven to be a particularly suitable yellow-emitting phosphor. A combination of Y and Tb is preferred. In this case, the long-wave shift caused by Tb has a particularly positive effect with a view to achieving a sufficient red proportion.

A CaMg chlorosilicate framework which, according to the invention, is doped with europium (Eu), is preferably a particularly suitable green-emitting phosphor (its peak emission wavelength preferably lies in the 500 to 525 nm region). If appropriate, it is also possible for small quantities of further dopants, in particular of manganese (Mn) to be added in small proportions for fine-tuning. A further alternative is a green phosphor of type $SrAl_2O_4:Eu^{2+}$ or $Sr_4Al_{14}O_{25}:Eu^{2+}$.

In the color diagram, the color locus of the green phosphor, together with the color locus of the yellow phosphor and that of the blue LED (or of the blue phosphor), encloses a broad triangle, creating additional possibilities for adapting to specific requirements. The variation range of the color locus of different garnets, by contrast, is considerably less. Therefore, it is also possible for the color temperature which can be achieved to be scattered over a wide range, typically from 4000 to 10000 K.

The invention is particularly advantageous in connection with the development of a white-emitting illumination unit. This is an illumination unit which is based either on an LED array or on individual LEDs or is a direct luminescence conversion LED in which the phosphors are in direct or indirect contact with the chip, i.e. are applied directly to the chip or are embedded in the resin surrounding it.

White light can be generated by a combination of LEDs which emit UV or blue light (referred to overall in the present description as "short-wave" light) with an emission wavelength (peak) of between 300 and 470 nm and the phosphor mixture according to the invention, which completely or partially absorbs the radiation from the LED and itself emits in spectral regions in which its additive mixture with the light of the LED results in white light with good color rendering. It may be necessary to add an additional blue-emitting phosphor component (for example BAM). Particularly efficient excitation is achieved, in the case of a UV LED, at an emission wavelength (peak) of approximately 330 to 350 nm and, in the case of a blue LED, at an emission wavelength (peak) of approximately 450 to 470 nm.

The result is an improved color rendering of the known white LED based on a garnet phosphor, for example by admixing 20 to 50% by weight of the chlorosilicate phosphor. The yellow-emitting phosphor is a garnet of the rare earths (RE) Y, Gd, Lu, La and/or Tb, in accordance with the formula $RE_3(Al, Ga)_5O_{12}:Ce$, in particular where RE=Y and/or Tb, in particular in accordance with the formula YAG:Ce or TbAG:Ce.

The phosphor $Ca_8Mg(SiO_4)_4Cl_2:Eu^{2+}$ is known from the scientific literature, without this literature indicating any specific application for the phosphor. According to the invention, this phosphor is emanately suitable for use in white LEDs, particularly advantageously based on a three-color mixture which is excited by a primary UV light source (300 to 390 nm) . However, it is also suitable for special applications in a white LED with blue primary light source (430 to 470 nm). The proportion x of the europium is advantageously between x=0.005 and 1.6, and in particular between x=0.01 and x=1.0. This provides the empirical formula $Ca_{8-x}Eu_xMg(SiO_4)_4Cl_2$.

The addition of Mn as further dopant in addition to Eu, in small quantities (up to approximately 20% of the molar proportion of Eu), allows the emission to be shifted in a controlled manner out of the green spectral region more toward the long-wave region, i.e. into the yellow spectral region. This has the advantage of enabling the emission to be better matched to the human eye and therefore also of improving the visual use effect. The proportion y of the Mn should be at most y=0.1. It is particularly preferable for the proportion of the europium to be between x=0.05 and 0.8, without manganese being added.

The europium concentration influences the color locus of the emission light when used in a light source, in particular an LED. The color locus of this phosphor can be additionally fine-tuned using the ratio of the two concentrations Eu:Mn, which simplifies or optimizes adaptation to any further (yellow or blue) phosphors in the LED.

The phosphors according to the invention can also be used, for example, in an appliance in which an LED array (UV or blue primary emission) illuminates phosphors on a transparent plate or in which individual LEDs illuminate phosphors which are arranged on a lens.

It is particularly advantageous for the phosphors according to the invention to be used to produce a white LED of high color rendering. For this purpose, the phosphors are applied either separately or in a mixture, and if appropriate are combined with a binder which as far as possible is transparent (EP 862 794). The phosphors completely or partially absorb the light from the LED which emits UV/blue light and emit it again in other spectral regions (primarily yellow and green) in a sufficiently broadband (specifically with a significant proportion of red) that an overall emission with the desired color locus is formed. Hitherto, there has been scarcely any knowledge of phosphors which satisfy these requirements as well as the phosphors in their combination described here. They have a high quantum efficiency (around 70%) and, at the same time, a spectral emission which is found to be bright, on account of the sensitivity of the eye. The color locus can be set within a wide range.

A suitable light source is an LED (light-emitting diode), which generates white light, either by directly mixing the green- or yellow-emitting phosphor with the primary radiation in the blue spectral region (430 to 470 nm) or by converting radiation which is primarily emitted as UV radiation into white by means of a plurality of phosphors (complete BYG mixing by means of three phosphors). In general, in the present context the terms blue, yellow and green will be understood as meaning emission maxima in the regions blue: 430 to 470 nm, green: 490 to 525 nm and yellow: 545 to 590 nm.

The primary light source used is the radiation from a UV-emitting or blue-emitting chip. Particularly good results are achieved with a UV-LED whose emission maximum lies at 330 to 370 nm. An optimum has been found to lie at 355 to 365 nm, taking particular account of the excitation spectrum of the garnets and chlorosilicates. The blue phosphor used here is, for example, BAM. In the case of a blue chip, particularly good results can be achieved with a peak wavelength of 430 to 470 nm. An optimum has been found to lie at 445 to 460 nm, taking particular account of the excitation spectrum of the garnets and chlorosilicates.

A variant with particularly good color rendering is the joint use of two phosphors, namely a phosphor with a high Tb content, preferably pure TbAG:Ce, together with chlorosilicate:Eu. A variant with particularly good temperature stability is the joint use of two phosphors, namely a phosphor with a high Y content, preferably pure YAG:Ce, together with chlorosilicate: Eu.

A particularly suitable LED which emits UV or blue radiation (referred to as short-wave radiation for short below) as primary radiation is a Ga(In)N LED, or alternatively any other short-wave emitting LED which emits in the 300 to 470 nm region. In particular, it is recommended for the main emission region to lie in the UV region (320 to 360 nm) and in the blue region (430 to 470 nm), since this is when the efficiency is highest.

BRIEF DESCRIPTION OF THE DRAWING

The invention is to be explained in more detail below with reference to a number of exemplary embodiments. In the drawing.

DETAILED DESCRIPTION OF THE DRAWINGS

The following text provides a more detailed description, by way of example, of the synthesis of an Eu-doped and Mn-doped chlorosilicate $Ca_8Mg(SiO_4)_4Cl_2$: $(Eu^{2+},Mn^{2+})$. Then, the suitability of this phosphor is documented on the basis of a number of exemplary measurements.

The phosphor powder is produced by means of a high-temperature solid-state reaction. For this purpose, by way of example, the highly pure starting materials $CaCO_3$, MgO, $SiO_2$ and $CaCl_2$ are mixed together in a molar ratio of 7:1:4:1.5. A small quantity of $Eu_2O_3$ or $MnCO_3$ is added for doping purposes, replacing the corresponding molar quantity of $CaCO_3$. This corresponds to the empirical formula $Ca_{8-x-y}Eu_xMn_yMg(SiO_4)_4Cl_2$ plus 0.5 $CaCl_2$.

After the individual components have been well mixed, the powder is heated at 1000–1200° C. for 1–4 h in a reducing atmosphere ($H_2/N_2$), so that it reacts with the compound described above. To remove excess $CaCl_2$ and other water-soluble foreign phases, the powder can be washed again using fully deionized water. The result is a phosphor powder with high quantum efficiencies (typically approximately 70%) when excited in the short-wave wavelength region around 400 nm.

Figure 1:
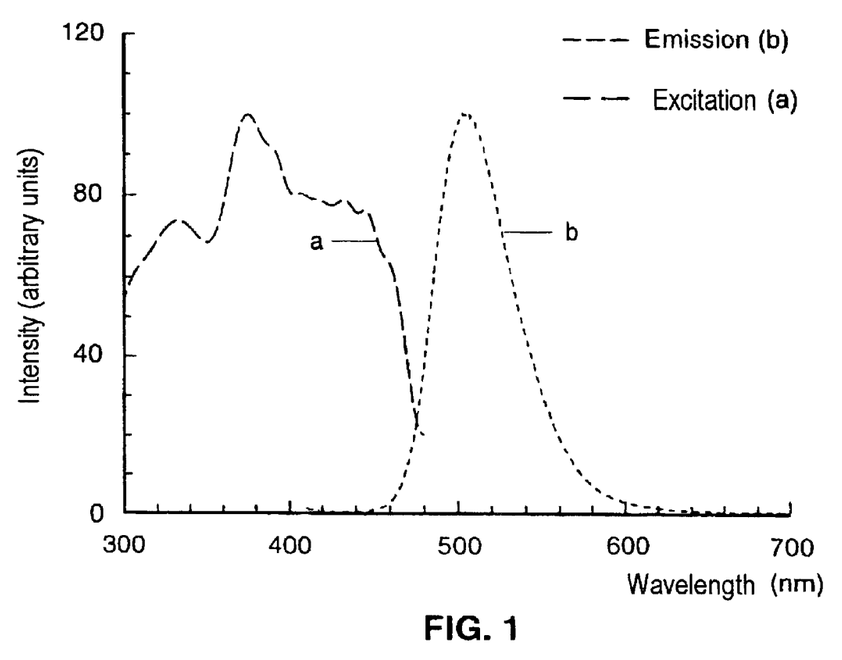
FIG. 1 shows the excitation and emission spectrum of an europium-doped chlorosilicate.

FIG. 1 shows a typical excitation and emission spectrum of a europium-doped powder. The amount of $Eu_2O_3$ added is 0.03 mol, i.e. x=0.06. The efficiency of excitation over a very wide wavelength region from 300 to 470 nm, primarily 360 to 400 nm, is quite clear from this figure. The reduction in excitability at greater wavelengths is caused by the $Eu^{2+}$ absorption band. However, at 460 nm, quantum efficiencies which are comparable to those at 400 nm or even shorter wavelengths (down to approximately 340 nm) are still measured.

The emission spectrum has an $Eu^{2+}$ emission band with a maximum at about 507 nm. This emission appears green to the eye. If desired, the emission behavior of the phosphor can be better matched to the sensitivity of the eye by co-doping with a small quantity of manganese.

Figure 2A:
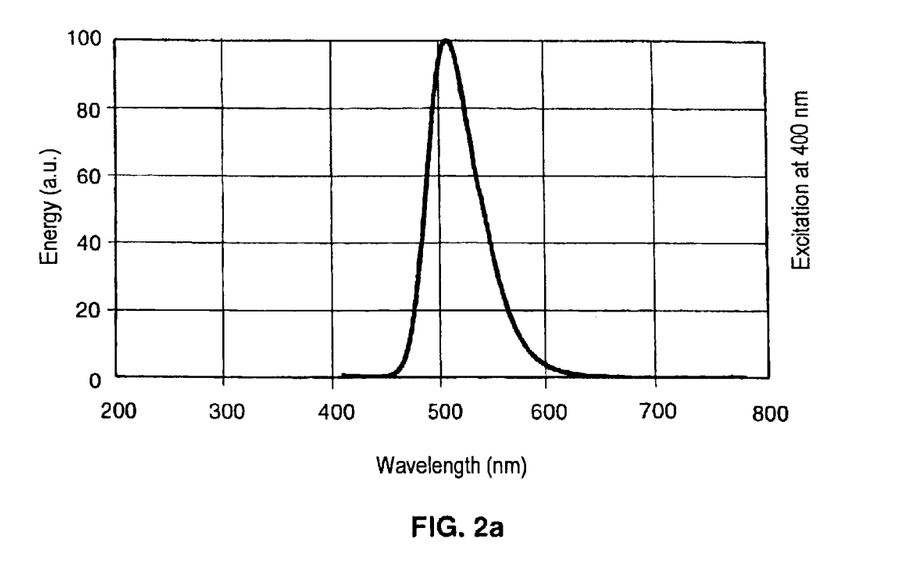
FIG. 2 shows the reflection and emission spectrum of a further europium-doped chlorosilicate.
Figure 2B:
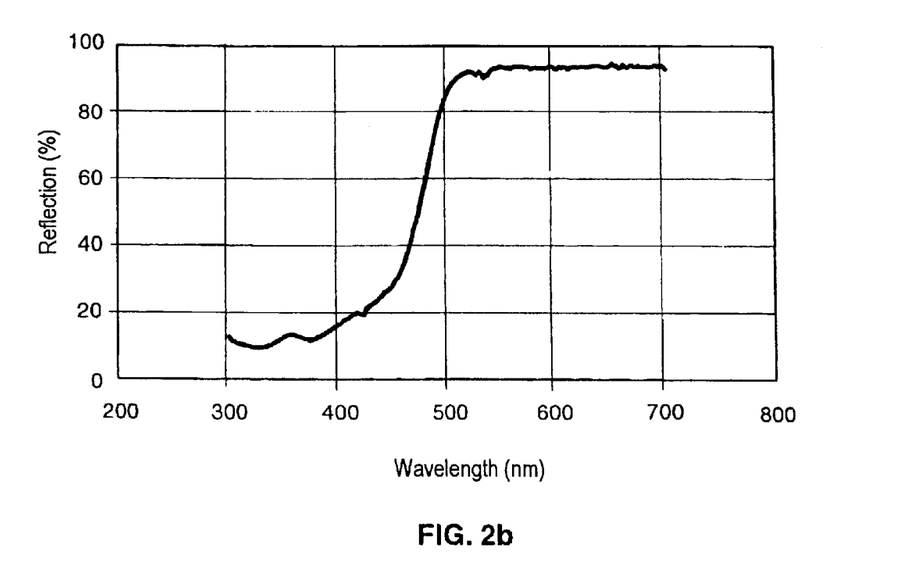

FIG. 2 shows a further exemplary embodiment of an Eu-doped chlorosilicate $Ca_8Mg(SiO_4)_4Cl_2:Eu^{2+}$ (CS:Eu for short). The amount of $Eu_2O_3$ added is 0.2 mol, i.e. x=0.4. The peak wavelength is at 509 nm, the mean wavelength at 522 nm. The color coordinates are x=0.185 and y=0.615. The emission when irradiated at 400 nm is shown in arbitrary units in FIG. 2a. Furthermore, the reflection (in percent) is also indicated in FIG. 2b.

Figure 3:
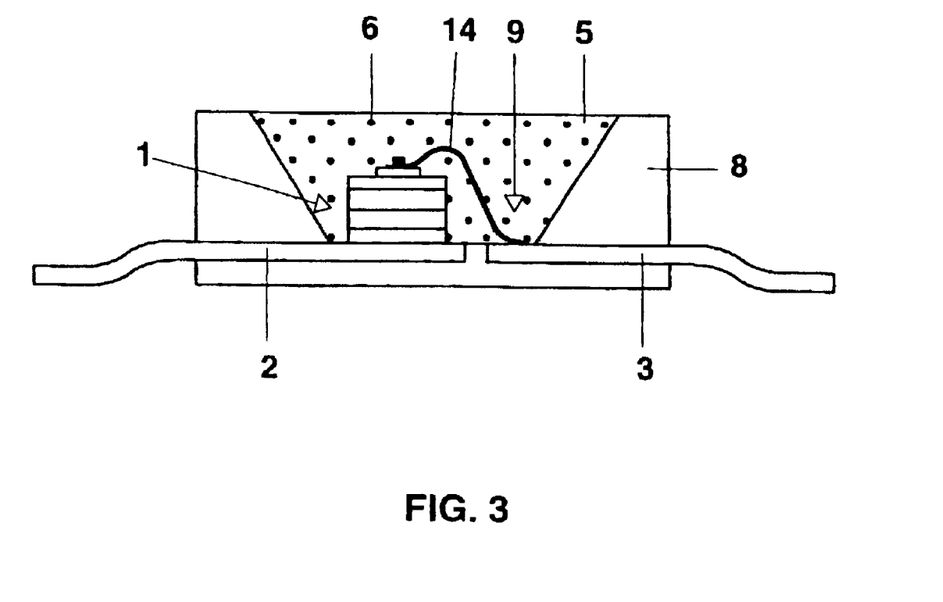
FIG. 3 shows a semiconductor component which is used as light source (LED) for white light.

For use in a white LED together with a GaInN chip, by way of example a structure similar to that described in U.S. Pat. No. 5,998,925 is used. The structure of a light source of this type for white light is specifically shown in FIG. 3. The light source is a semiconductor component (chip 1) of type InGaN with a peak emission wavelength of 450 nm, having a first and a second electrical connection 2, 3 embedded in an opaque base housing 8 in the region of a recess 9. One of the connections 3 is connected to the chip 1 via a bonding wire 14. The recess has a wall 17 which serves as reflector for the blue primary radiation from the chip 1. The recess 9 is filled with a potting compound 5, the principal constituents of which are an epoxy casting resin (80 to 90% by weight) and phosphor pigments 6 (less than 15% by weight). Any other small fractions are methyl ether and aerosil, inter alia.

Figure 4:
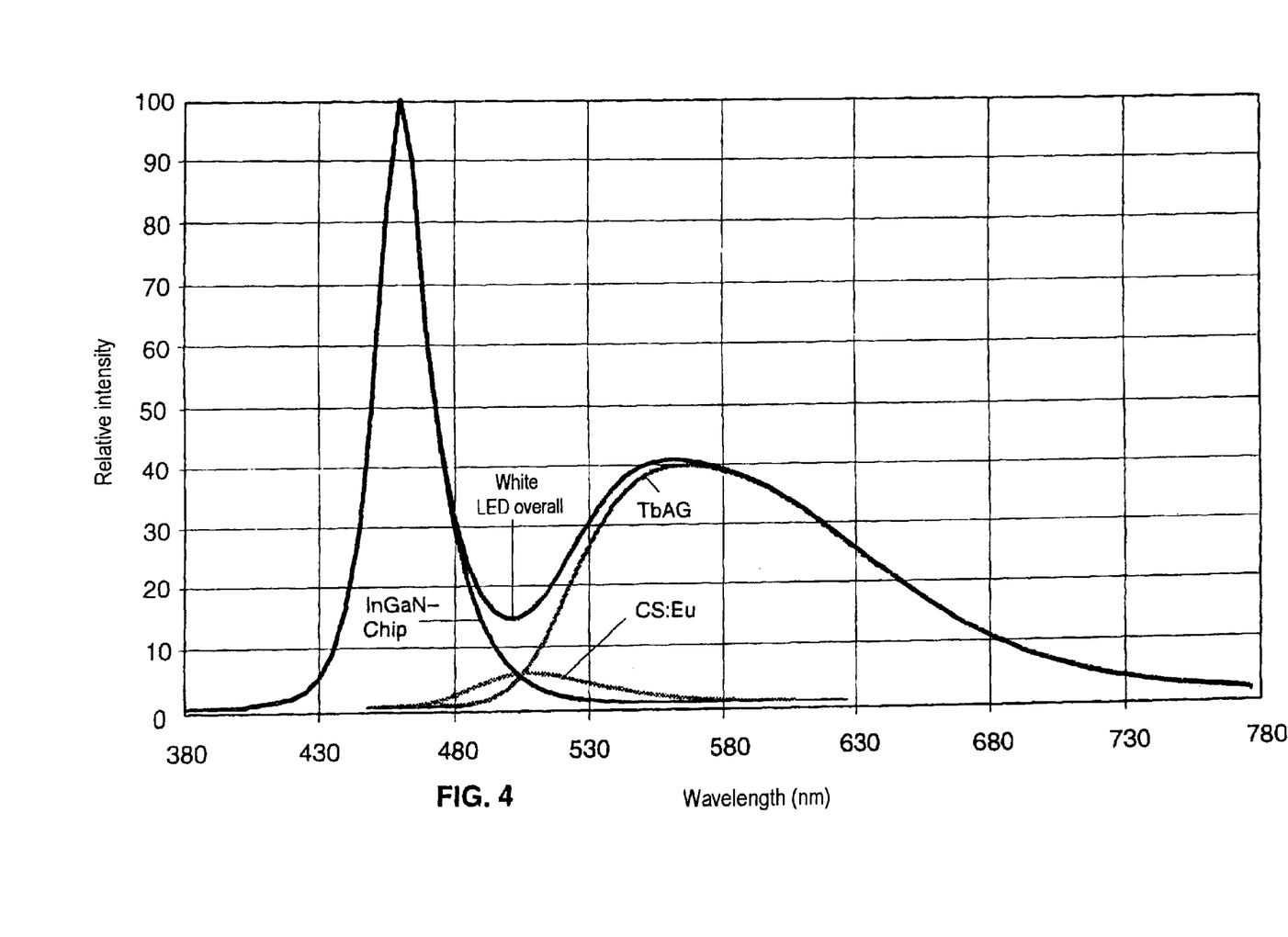
FIG. 4 shows the emission spectrum of the LED from FIG. 3, using the phosphors TbAG and CS:Eu in accordance with the present invention.

In this arrangement, the chlorosilicate phosphor (CS:Eu) of the second exemplary embodiment together with TbAG:Ce are used for the phosphor pigments. The mixing ratio (CS:Eu) to TbAG is 4:6 (parts by weight). This exemplary embodiment is distinguished by a particularly high color rendering of Ra=85. The emission spectrum of this exemplary embodiment is shown in FIG. 4.

Figure 5:
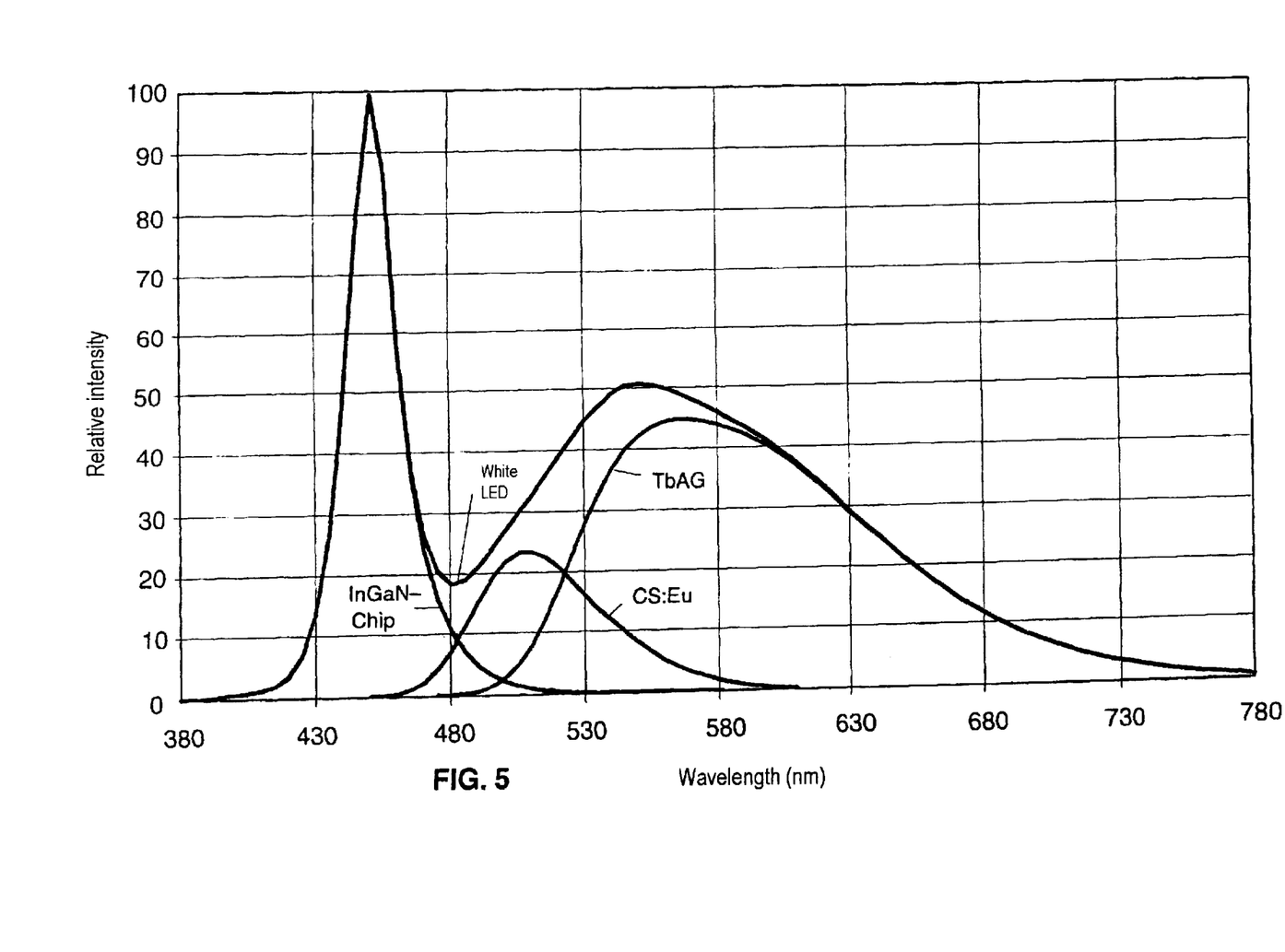
FIG. 5 shows the emission spectrum of a further LED using the phosphors TbAG and CS:Eu in accordance with the present invention.

A direct comparison between a conventional solution (BG) and a solution according to the invention (BYG) reveals the following result: the BG solution selected was a blue-emitting InGaN chip (peak at 450 nm) together with conventional YAG:Ce. The BYG solution according to the invention selected was the same LED together with TbAG:Ce and CS:Eu. This in each case leads to a color temperature of 6000 K at a color locus with x=0.322 and y=0.366. While the simple BG solution only achieves a color rendering of Ra=72, the BYG solution achieves a color rendering of Ra=80. The red rendering is also considerably improved, namely from R9=−22 to R9=10. The emission spectrum of the BYG solution is shown in FIG. 5.

Figure 6:
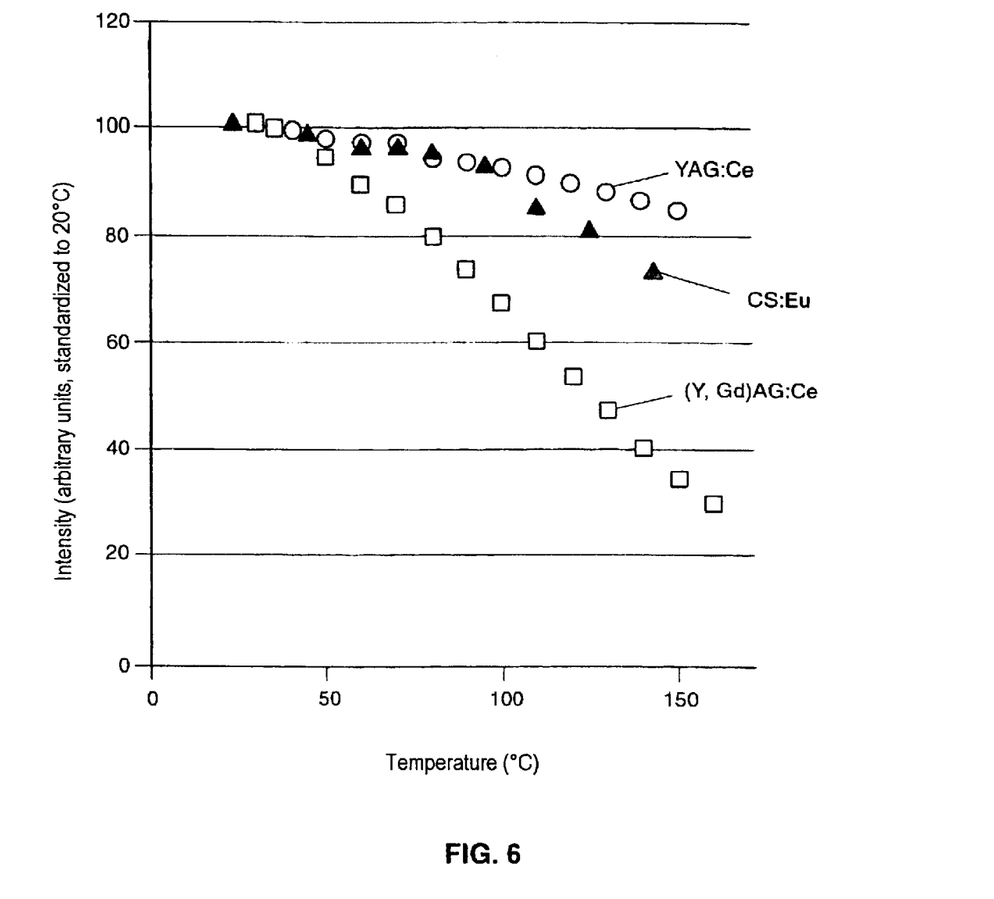
FIG. 6 shows the temperature behavior of an LED using the phosphors YAG and CS:Eu in accordance with the present invention.
Figure 7:
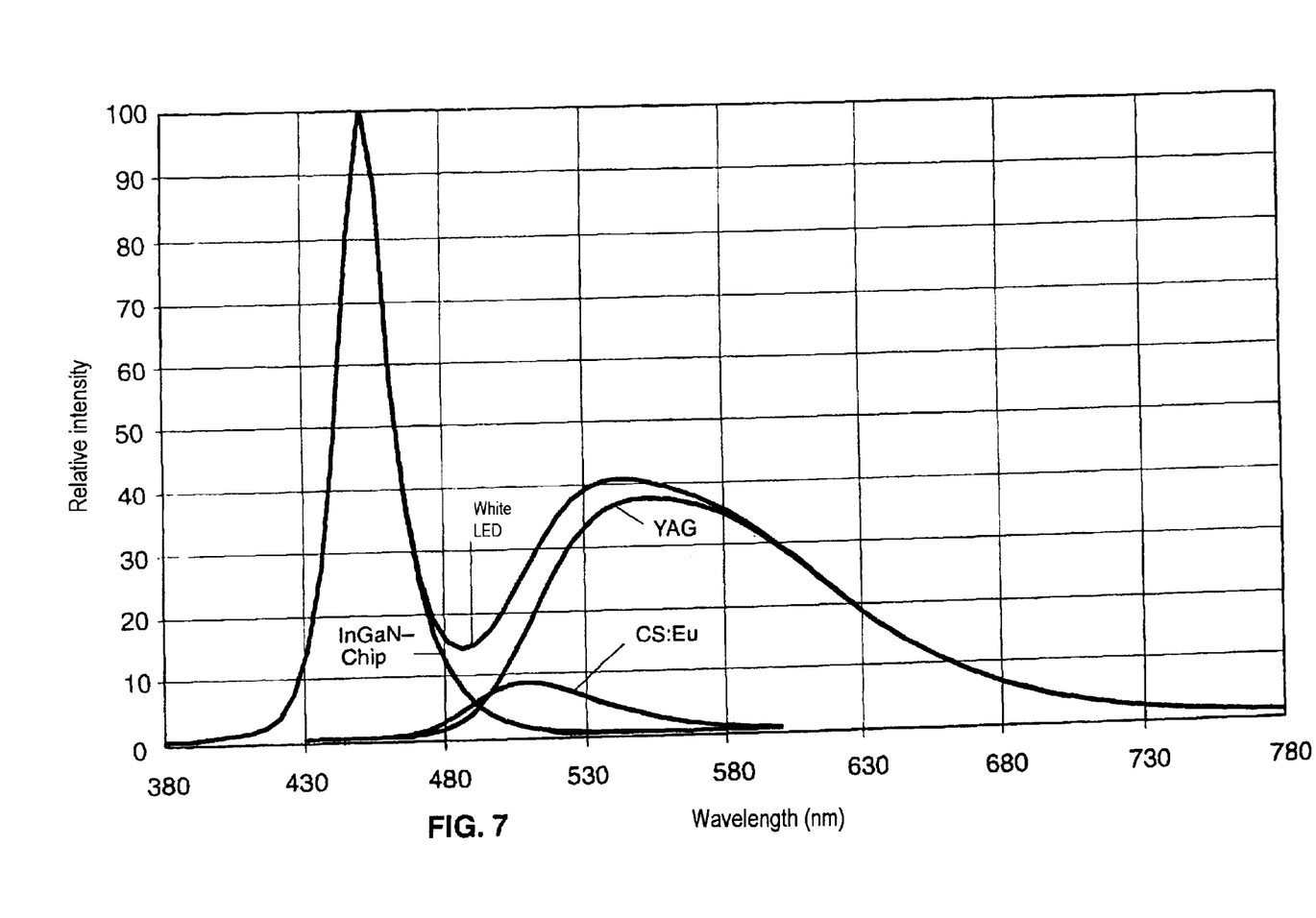
FIG. 7 shows the emission spectrum of an LED using the phosphors YAG and CS:Eu in accordance with the present invention.

A further preferred exemplary embodiment of a white LED uses, in addition to the InGaN chip (blue emission at 450 nm), the combination of the abovementioned chlorosilicate phosphor (CS:Eu) with YAG:Ce. This exemplary embodiment is distinguished by an extremely similar temperature-extinguishing behavior of both phosphors, as can be seen from FIG. 6. The temperature-extinguishing behavior of both phosphors is practically identical over the permissible range of use (up to approximately 100° C.) and is only slightly temperature-dependent. Other garnets, such as for example the mixed garnet $(Y_{0.33}Gd_{0.63}Ce_{0.04})Al_5O_{12}$, which was also investigated for comparative purposes, have a considerably worse constancy of temperature (in FIG. 6, this mixed garnet is referred to as (Y,Gd)AG:Ce). Therefore, particular constancy of the color locus and of further lighting data is ensured under a very wide range of temperature conditions in this exemplary embodiment, which contains a high level of Y (or alternatively Tb) as RE (at least 60 mol % of the RE lattice position). The emission spectrum of this exemplary embodiment is shown in FIG. 7. It corresponds to a color temperature of 8000 K and a color locus having the coordinates x=0.294 and y=0.309. The color rendering is Ra=77. The mixing ratio of the two phosphors is 4.6:1.

Figure 8:
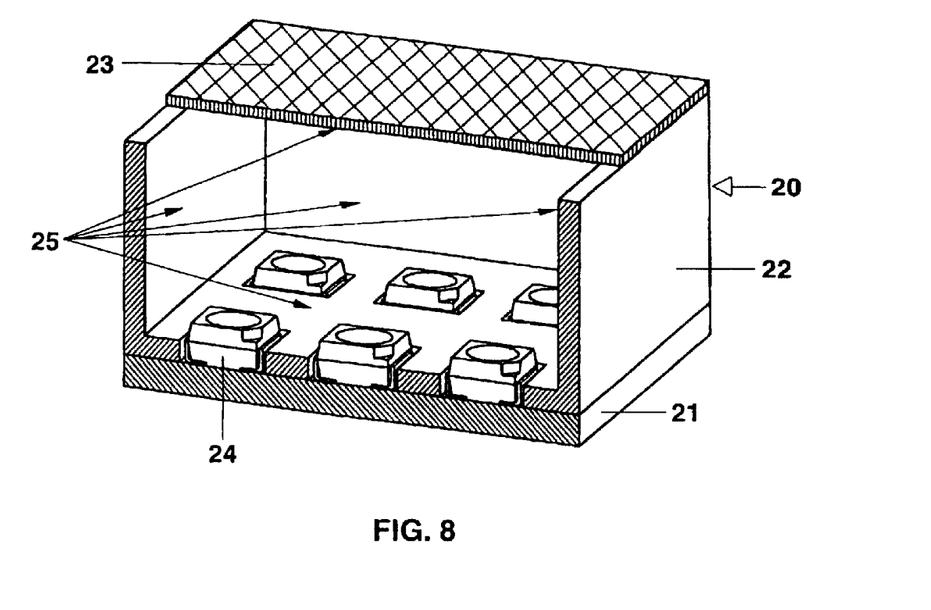
FIG. 8 shows an illumination unit using phosphors in accordance with the present invention.

FIG. 8 shows a surface-lighting fitting 20 as illumination unit. It comprises a common support 21, to which a cuboidal outer housing 22 is adhesively bonded. Its upper side is provided with a common cover 23. The cuboidal housing has cutouts in which individual semiconductor components 24 are accommodated. They are UV-emitting LEDs with a peak emission of 360 nm. The conversion into white light takes place by means of conversion layers 25 which are arranged on all surfaces which are accessible to the UV radiation. These include the inner surfaces of the side walls of the housing, of the cover and of the base part. The conversion layers 25 consist of three phosphors which emit in the yellow, green and blue spectral regions using the phosphors according to the invention.

What is claimed is:

1. A white-emitting illumination unit, having at least one LED as light source, the LED emitting primary radiation in the 300 to 470 nm region, this radiation being partially or completely converted into longer-wave radiation by phosphors which are exposed to the primary radiation of the LED, characterized in that the conversion takes place at least with the aid of a green-emitting phosphor which originates from the class of the Eu-activated calcium magnesium chlorosilicates and of at least one yellow-emitting phosphor which originates from the class of the Ce-activated rare earth garnets.

2. The white-emitting illumination unit as claimed in claim 1, characterized in that the green-emitting phosphor satisfies the empirical formula $Ca_{8-x-y}Eu_xMn_yMg(SiO_4)_4Cl_2$, where x is between x=0.005 and x=1.6 and y is between y=0 and y=0.1 (in each case including cut-off values).

3. The white-emitting illumination unit as claimed in claim 1, characterized in that the yellow-emitting phosphor is a garnet of the rare earths (RE) Y, Gd, Lu, La and/or Tb, in accordance with the formula $RE_3(Al,Ga)_5O_{12}:Ce$, in particular where RE=Y and/or Tb, in particular in accordance with the formula YAG:Ce or TbAG:Ce.

4. The white-emitting illumination unit as claimed in claim 1, characterized in that the primary emitted radiation lies in the 330 to 370 nm wavelength range, the primary emitted radiation being exposed to three phosphors with emission maxima in the blue region (430 to 470 nm), the green region (490 to 525 nm) and the yellow region (545 to 590 nm).

5. The white-emitting illumination unit as claimed in claim 1, characterized in that the primary emitted radiation lies in the blue wavelength region from 430 to 470 nm, the primary emitted blue radiation being exposed to two phosphors with emission maxima in the yellow region (545 nm to 590 nm) and in the green region (490 to 525 nm) as set forth in one of the preceding claims.

6. The white-emitting luminescence conversion LED as set forth in claim 1, characterized in that a short-wave light-emitting diode, in particular based on Ga(In)N, is used as primary radiation source.

7. The white-emitting illumination unit as claimed in claim 1, characterized in that the proportion of europium is between x=0.1 and x=1.0, without Mn additionally being used.

8. The white-emitting illumination unit as claimed in claim 1, characterized in that the illumination unit is a luminescence conversion LED in which the phosphors are in direct or indirect contact with the chip.

9. The white-emitting illumination unit as claimed in claim 1, characterized in that the illumination unit is an array of LEDs.

10. The white-emitting illumination unit as claimed in claim 9, characterized in that at least one of the phosphors is arranged on an optical device which has been arranged in front of the LED array.

UNITED STATES PATENT AND TRADEMARK OFFICE
CERTIFICATE OF CORRECTION

PATENT NO. : 6,504,179 B1
DATED : January 7, 2003
INVENTOR(S) : Andries Ellens It is certified that error appears in the above-identified patent and that said Letters Patent is hereby corrected as shown below:

<u>Title page,</u>
Item [30], Foreign Application Data, delete "Feb. 11, 2001" and insert
-- May 11, 2001 --

Signed and Sealed this

Seventeenth Day of August, 2004

JON W. DUDAS
*Acting Director of the United States Patent and Trademark Office*